United States Patent
Shiota et al.

(10) Patent No.: US 8,270,446 B2
(45) Date of Patent: Sep. 18, 2012

(54) SEMICONDUCTOR LASER DEVICE

(75) Inventors: Takashi Shiota, Saitama (JP); Takeshi Kitatani, Hino (JP)

(73) Assignee: Oclaro Japan, Inc., Kanagawa (JP)

( * ) Notice: Subject to any disclaimer, the term of this patent is extended or adjusted under 35 U.S.C. 154(b) by 41 days.

(21) Appl. No.: 12/718,009

(22) Filed: Mar. 5, 2010

(65) Prior Publication Data
US 2010/0232468 A1    Sep. 16, 2010

(30) Foreign Application Priority Data

Mar. 13, 2009    (JP) .................................. 2009-61093

(51) Int. Cl.
*H01S 5/00*    (2006.01)

(52) U.S. Cl. .................... 372/43.01; 372/41; 372/45.01; 372/46.01; 372/50.1

(58) Field of Classification Search .................... 372/41, 372/43.01, 45.01, 46.01
See application file for complete search history.

(56) References Cited

U.S. PATENT DOCUMENTS

| 2002/0176459 A1* | 11/2002 | Martinsen ........................ 372/34 |
| 2002/0187580 A1 | 12/2002 | Kondo et al. |
| 2003/0067010 A1* | 4/2003 | Iga et al. ........................ 257/103 |

FOREIGN PATENT DOCUMENTS

| JP | 1-302791 | 12/1989 |
| JP | 2002-314196 | 10/2002 |

OTHER PUBLICATIONS

"4d- and 5d-transition metal acceptor doping of InP" by A. Dadgar et al (8th Int'l. Conference on MOVPE, abstract, PDSP.7. Jun. 1996).

* cited by examiner

*Primary Examiner* — Dung Nguyen
(74) *Attorney, Agent, or Firm* — Antonelli, Terry, Stout & Kraus, LLP.

(57) ABSTRACT

High performance and high reliability of a semiconductor laser device having a buried-hetero structure are achieved. The semiconductor laser device having a buried-hetero structure is manufactured by burying both sides of a mesa structure by a Ru-doped InGaP wide-gap layer and subsequently by a Ru-doped InGaP graded layer whose composition is graded from InGaP to InP, and then, by a Ru-doped InP layer. By providing the Ru-doped InGaP graded layer between the Ru-doped InGaP wide-gap layer and the Ru-doped InP layer, the Ru-doped InGaP wide-gap layer and the Ru-doped InP layer not lattice-matching with each other can be formed as a buried layer with excellent crystallinity.

16 Claims, 8 Drawing Sheets

RELATION BETWEEN Ga COMPOSITION AND CRITICAL THICKNESS

FIG. 5

RELATION BETWEEN Ga COMPOSITION AND ΔE

SEMICONDUCTOR LASER DEVICE

CROSS-REFERENCE TO RELATED APPLICATION

The present application claims priority from Japanese Patent Application No. JP 2009-061093 filed on Mar. 13, 2009, the content of which is hereby incorporated by reference into this application.

TECHNICAL FIELD OF THE INVENTION

The present invention relates to a semiconductor laser device. More particularly, the present invention relates to a technique effectively applied to a semiconductor laser device having a buried-hetero structure.

BACKGROUND OF THE INVENTION

With an explosive Internet population growth in recent years, achievement of a high-speed and large-volume information transmission has been rapidly required, and it is considered that optical communication plays an important role also in the future.

A semiconductor laser device is mainly used as a light source for the optical communication. For example, for short-distance use such as a transmission distance up to about 10 km, a direct-modulation method of directly driving a semiconductor laser by an electric signal is used. This direct-modulation method has a feature of low power consumption because a module can be achieved by a simple structure. Also, low cost can be achieved because of a small number of components.

On the other hand, only the direct modulation of the semiconductor laser cannot handle a long-distance optical communication such as a transmission distance over 10 km, and therefore, an electro-absorption (EA) modulator-integrated semiconductor laser in which optical modulators are integrated is used for the long-distance use. Further, for an optical communication such as a distance over 80 km, a Mach-Zehnder (MZ) modulator having small chirping is used.

Figure 1A:
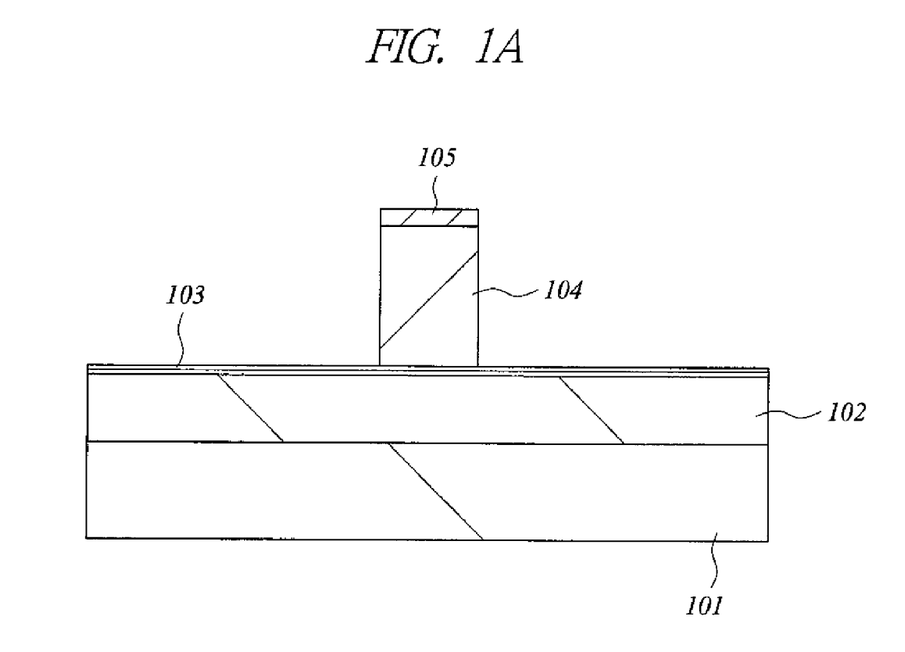
FIG. 1A is a cross-sectional view of a principal part along a direction of mesa stripes of a conventional ridge-waveguide-type laser device.
Figure 1B:
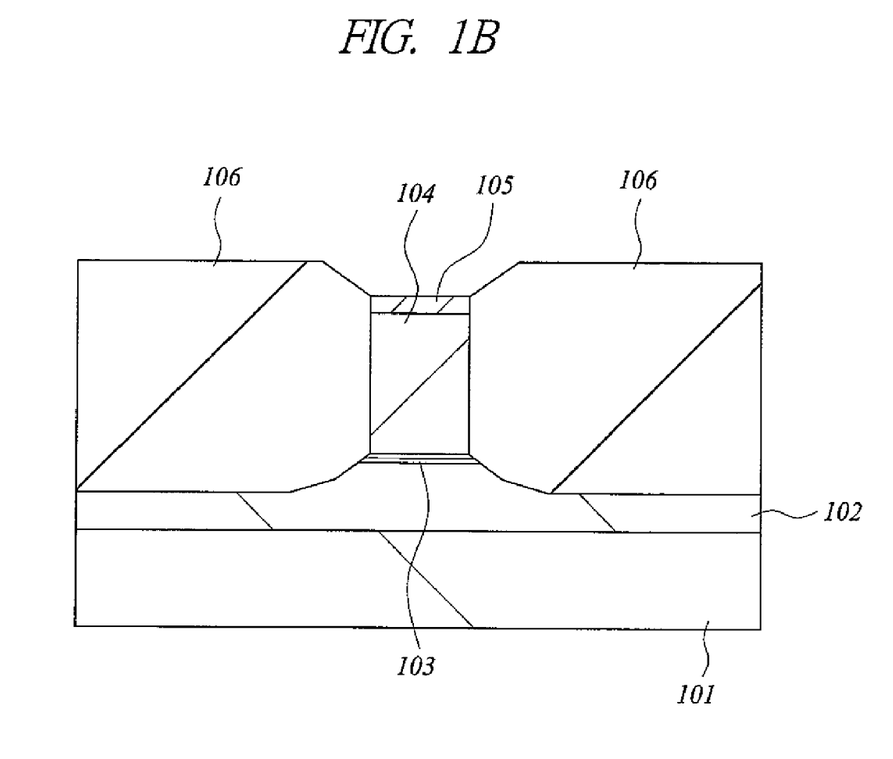
FIG. 1B is a cross-sectional view of a principal part along a direction of mesa stripes of a conventional buried-hetero-type laser device.

Basic structures of the optical-communication semiconductor laser are briefly categorized into two types of a ridge-waveguide (RWG) structure and a buried-hetero (BH) structure (hereinafter simply referred to as a buried structure). FIGS. 1A and 1B are cross-sectional views along a direction of mesa stripes of these two types of structures.

In a ridge-waveguide structure illustrated in FIG. 1A, when an upper cladding layer 104 and a contact layer 105 formed on a semiconductor substrate 101 are etched to form a mesa stripe whose width is several run, an excess portion is removed down to right above an active layer 103 by etching. At this time, the active layer 103 is not etched, and therefore, a reactive current component exists, the reactive current component not injected into the active layer 103 to be spread at a current injection.

On the other hand, in a buried structure illustrated in FIG. 1B, when a mesa stripe is formed, not only the upper cladding layer 104 but also the active layer 103, a lower cladding layer 102, and the semiconductor substrate 101 are etched, and a buried layer 106 formed of a semi-insulating semiconductor is grown on both sides of the mesa structure. In this case, since a current can be efficiently injected only to the active layer by the high-insulating buried layer 106, a laser can be operated with a lower threshold current than that of the ridge-waveguide structure in principle.

In a manufacture of a conventional InP-based buried semiconductor laser device, a metal-organic vapor phase epitaxy (MOVPE) method capable of high-quality buried regrowth has been mainly used as a method for growing a semiconductor layer. Also, as a material for the high-insulating buried layer, Fe-doped InP has been used. However, since Fe has a property of crossdiffusion with Zn normally used as a p-type dopant, there are problems such that Zn diffuses from a p-type cladding layer to the buried layer to damage insulation properties, and conversely, Fe diffuses from the buried layer to the cladding layer to decrease conductivity.

Conventionally, the above-described Fe—Zn crossdiffusion is suppressed by decreasing a doping concentration of Fe as little as possible. Therefore, a current blocking effect is insufficient, and a leakage current component not injected into the active layer occurs, and therefore, an expected effect in the conventional buried semiconductor laser cannot be sufficiently obtained.

For such a problem, Dadgar and others have newly reported Ru as the semi-insulating dopant in place of Fe in 8th International Conference on MOVPE (8th International Conference on MOVPE, abstract, PDSP. 7, 1996). Thereafter, it was confirmed also through an experiment that Ru does not cross-diffuse with Zn, and it has been reported that a Ru-doped InP-based buried structure has characteristics superior to that of a conventional Fe-doped InP-based buried structure.

However, the above-described structure using the Ru-doped InP as the material for the semi-insulating buried layer does not have a sufficiently-large band gap with respect to the active layer and the InP cladding layer, and therefore, a leakage current in the buried layer is not sufficiently suppressed. Accordingly, to solve this problem, a technique has been suggested in which a wide-gap layer having a larger band gap than that of the InP cladding layer is provided between the InP cladding layer and the InP semi-insulating buried layer to suppress the leakage current.

Figure 2:
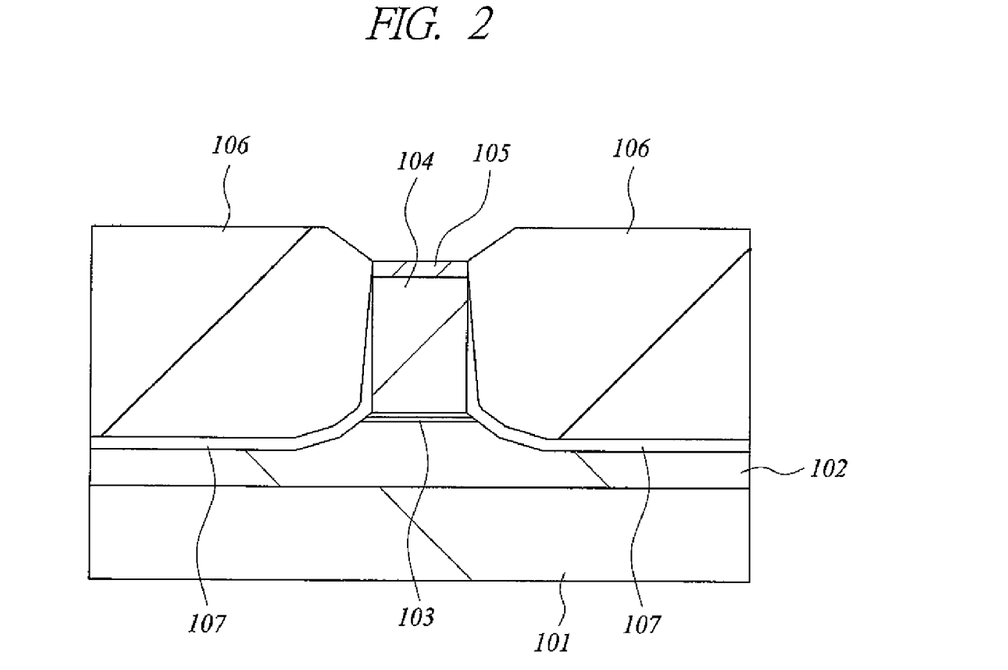
FIG. 2 is a cross-sectional view of a principal part of a conventional buried-hetero-type laser device in which a wide-gap layer is provided in a part of a buried layer.

FIG. 2 is a cross-sectional view along a direction of mesa stripes of a structure provided with the wide-gap layer. After a normal mesa structure is formed on the lower cladding layer 102, first, both sides of this mesa structure are buried with a wide-gap layer 107, and next, are buried with the buried layer 106.

As a prior art of the structure provided with the wide-gap layer, there are documents such as Japanese Patent Application Laid-Open Publication No. H01-302791 (Patent Document 1) and Japanese Patent Application Laid-Open Publication No. 2002-314196 (Patent Document 2). In Patent Document 1, an undoped InGaP layer having a larger band gap than that of an InP cladding layer or a Fe-doped InGaP layer is provided between an InP semi-insulating buried layer and the InP cladding layer to suppress a leakage current into the buried layer. And, in Patent Document 2, a Ru-doped InAlAs layer is provided as a wide-gap layer to suppress the leakage current.

SUMMARY OF THE INVENTION

However, in the device structure described in Patent Document 1, when the Fe-doped InGaP layer is provided between the InP semi-insulating buried layer and the InP cladding layer, this wide-gap layer and the InP cladding layer are directly contacted with each other. As a result, Fe in the wide-gap layer and Zn in the InP cladding layer cross-diffuse with each other, and therefore, an effect of providing the wide-gap layer is insufficient, and there is a problem that the current-blocking effect is insufficient.

Also, since InGaP is a distorted crystal which is not lattice-matched with InP, only a film thickness of about several-ten nm which is a critical thickness or thinner is grown. Therefore, even if the InGaP wide-gap layer is formed to be an undoped structure, the Fe—Zn crossdiffusion occurs between the Fe-doped InP semi-insulating buried layer and the InP cladding layer through the wide-gap layer.

As described above, the technique has been reported in which Ru is doped to an InP semi-insulating buried layer in order to suppress the Fe—Zn crossdiffusion. Accordingly, it is easily assumed that the above-described wide-gap layer made of Fe-doped InGaP is replaced to be made of Ru-doped InGaP. However, a new problem not arising in the conventional structure arises in this case. The problem is that it is difficult to obtain defect-free excellent crystallinity in the case of Ru-doped InGaP. A reason for the problem is that, in the case of a Ru-doped semiconductor, growth conditions for achieving semi-insulating characteristics are a lower temperature and a lower ratio of V-group elements to III-group elements than those of normal growth conditions, and therefore, a crystalline defect particularly tends to occur in a distorted crystal such as InGaP. Therefore, when the wide-gap layer is made of Ru-doped InGaP, a problem may arise in suppression of a leakage current and securement of device reliability.

Meanwhile, in Patent Document 2 describing a case that the wide-gap layer is made of Ru-doped InAlAs, unlike the case that Ru is doped to InP, an increase in resistivity has not been verified yet, and an effect as the current-blocking layer is insufficient. Also, since Al is contained in the semi-insulating buried layer, a problem may arise in the securement of device reliability.

A preferred aim of the present invention is to provide a technique of suppressing a leakage current into a semi-insulating buried layer in a semiconductor laser device having a buried structure.

Another preferred aim of the present invention is to provide a technique of suppressing deterioration in crystallinity of a wide-gap layer configuring a part of a semi-insulating buried layer in a semiconductor laser device having a buried structure.

The above and other preferred aims and novel characteristics of the present invention will be apparent from the description of the present specification and the accompanying drawings.

The typical ones of the inventions disclosed in the present application will be briefly described as follows.

According to an invention of the present application, Ru not crossdiffusing with Zn is used as a dopant for the semi-insulating buried layer, so that high insulation properties of the buried layer are maintained and the leakage current is suppressed. Also, the Ru-doped semi-insulating buried layer has a stacked structure formed of an InP layer and an InGaP wide-gap layer whose band gap is larger than that of InP, and the current-blocking effect by the InGaP wide-gap layer is used to suppress the leakage current. Further, a Ru-doped InGaP graded layer whose composition is graded from InGaP to InP is provided between the Ru-doped InP layer and the Ru-doped InGaP wide-gap layer, so that the deterioration in crystallinity of the Ru-doped semi-insulating buried layer is suppressed.

Figure 3:
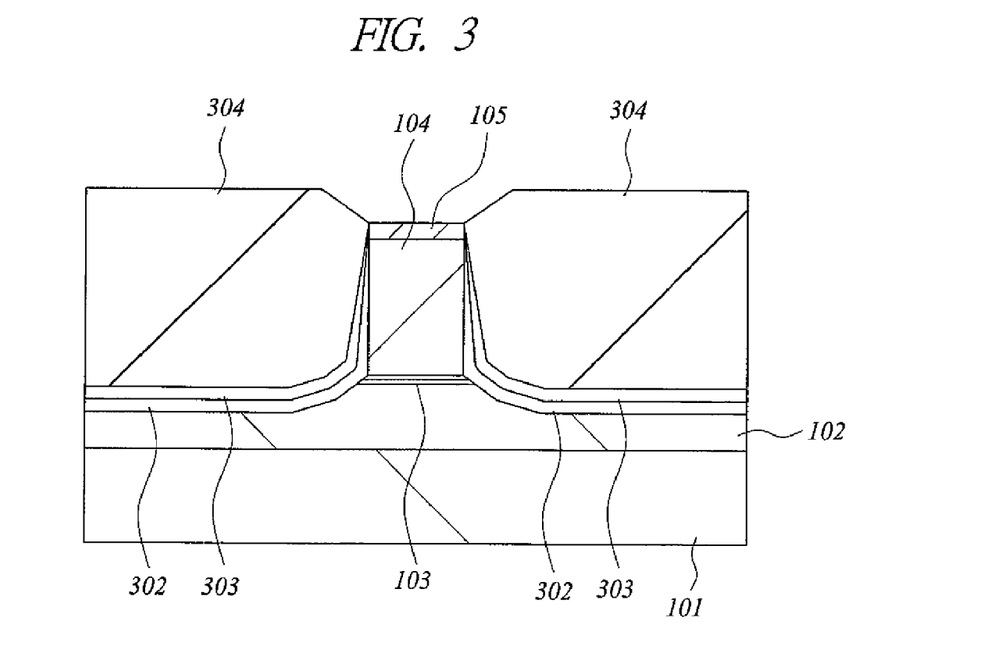
FIG. 3 is a cross-sectional view of a principal part along a direction of mesa stripes of a buried-hetero-type laser device according to the present invention.

FIG. 3 is a cross-sectional view along a direction of mesa stripes of the above-described structure. The structure is manufactured by, after forming a normal mesa structure, first burying both sides of the mesa structure with a Ru-doped InGaP wide-gap layer 302, next with a Ru-doped InGaP graded layer 303, and then with a Ru-doped InP layer 304.

A band gap of the above-described Ru-doped InGaP wide-gap layer 302 is larger as a composition ratio of Ga is larger, and therefore, the effect as the current-blocking layer is increased. However, since InGaP does not lattice-matched with InP, if a film thickness of InGaP is grown to be a critical thickness or thicker, a crystal defect occurs to affect deterioration in device characteristics, reliability, and others.

Figure 4:
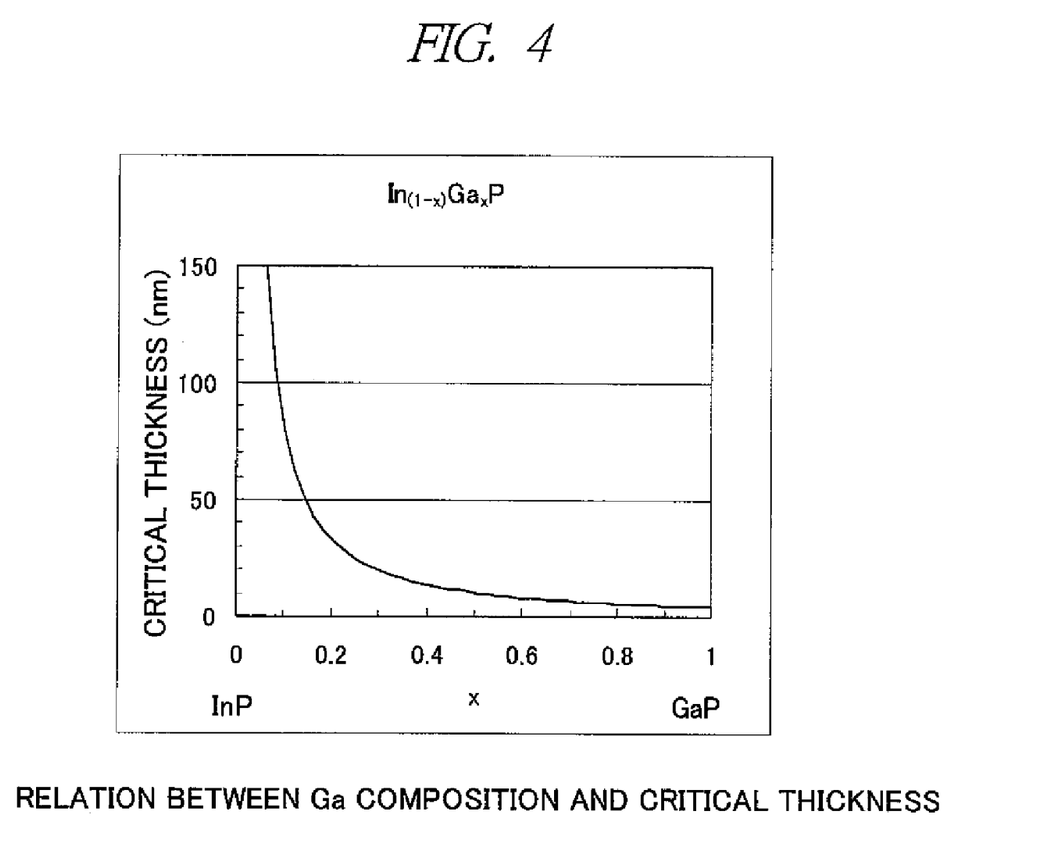
FIG. 4 is a graph illustrating a relation between a critical thickness and a composition of a Ru-doped InGaP layer forming the part of the buried layer of the buried-hetero-type laser device according to the present invention.

FIG. 4 illustrates a relation between a $Ga_x$ composition of $In_{(1-x)}Ga_xP$ and the critical thickness. It is found from FIG. 4 that the critical thickness at the $Ga_x$ composition ratio of 0.1 is about 80 nm, and therefore, with a film thickness of 80 nm or thinner, a film with excellent crystallinity can be grown.

Figure 5:
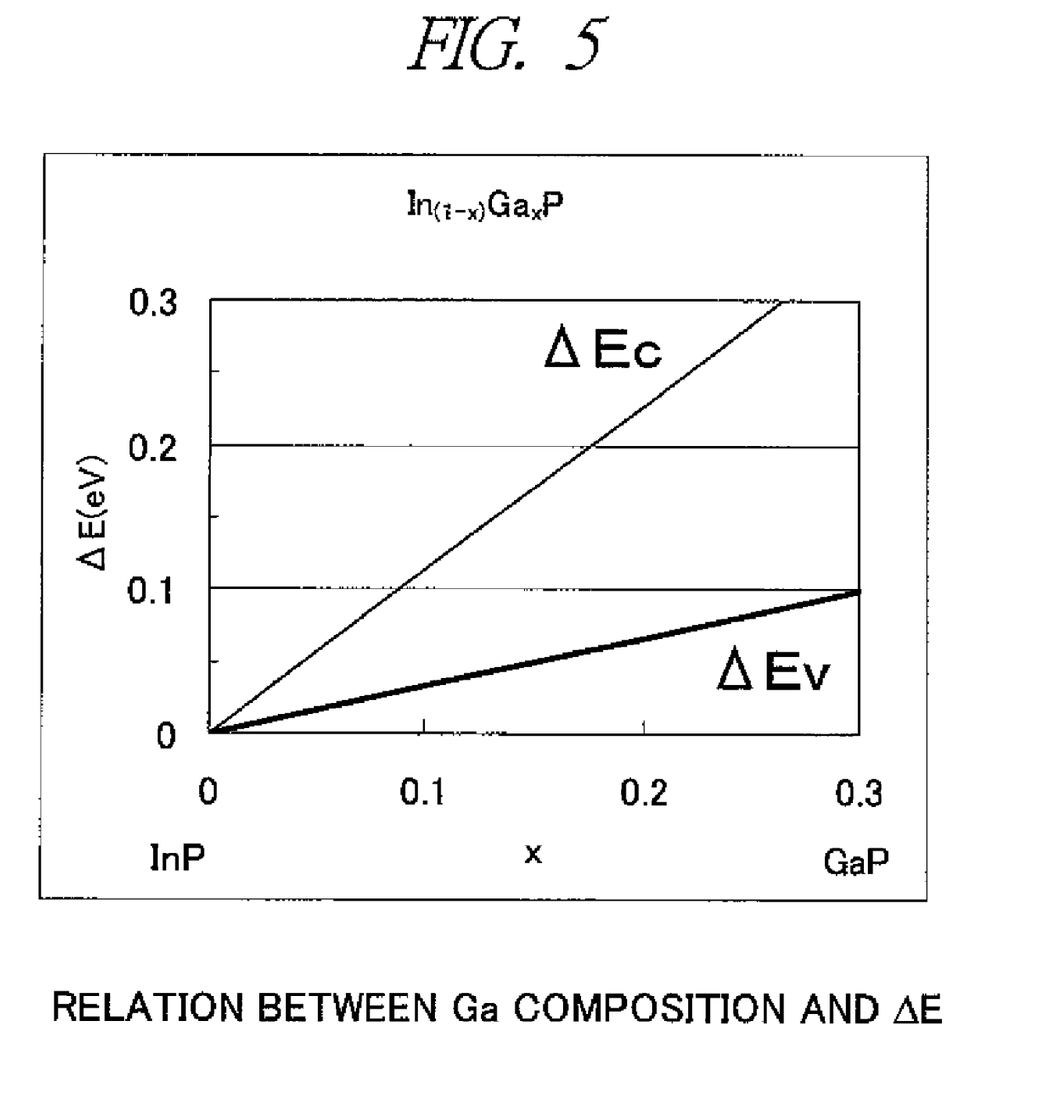
FIG. 5 is a graph illustrating a relation between a change amount of band-gap energy and a Ga composition of the Ru-doped InGaP layer forming the part of the buried layer of the buried-hetero-type laser device according to the present invention.

FIG. 5 illustrates a relation between the Ga composition of $In_{(1-x)}Ga_xP$ and a change amount of band-gap energy. It is found from FIG. 5 that the energy is larger as the Ga composition ratio is larger. For example, when the Ga composition ratio is 0.1, the energy is about 100 meV larger than that of InP, and is sufficient as the wide-gap layer, and therefore, the effect of suppressing the leakage current can be sufficiently obtained.

As described above, in the present invention, the Ru-doped InGaP graded layer whose composition is graded from InGaP to InP is provided between the Ru-doped InP layer and the Ru-doped InGaP wide-gap layer. With this structure, the Ru-doped InGaP layer and the Ru-doped InP layer not lattice-matching with each other can be formed as the buried layer with excellent crystallinity, and therefore, a device design in accordance with FIGS. 3 and 4 is possible, so that a high-performance and high-reliable Ru-doped semi-insulating buried layer can be achieved.

Note that, in the description of FIG. 3, the structure of the buried layer is formed of the InGaP layer, the InGaP graded layer, and the InP layer in this order from the active layer side. However, the present invention is not limited to the structure, and other structures shown in table. 1 are considered as long as the InGaP wide-gap layer is provided between the active layer and the Ru-doped InP layer and between the cladding layer and the Ru-doped InP layer. For example, the effect of the present invention can be obtained even if the structure is formed of the InGaP graded layer on a first layer, the InGaP layer on a second layer, and the InGaP graded layer on a third layer in this order from the active layer side between the active layer and the Ru-doped InP layer and between the cladding layer and the Ru-doped InP layer.

TABLE 1

| | Ru-DOPED SEMI-INSULATING BURIED LAYER | | | |
|---|---|---|---|---|
| | 1 | 2 | 3 | 4 |
| ACTIVE LAYER/ CLADDING LAYER | InGaP LAYER | InGaP GRADED LAYER | — | — |
| | InGaP GRADED LAYER | InGaP LAYER | InGaP GRADED LAYER | — |
| | InP LAYER | InGaP GRADED LAYER | InGaP LAYER | InGaP GRADED LAYER |
| | | InGaP LAYER | InGaP GRADED LAYER | — |

(Rightmost column: InP LAYER)

The effects obtained by typical aspects of the present invention will be briefly described below.

A high-performance semiconductor laser device having a buried structure can be achieved.

And, a high-reliable semiconductor laser device having a buried structure can be achieved.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted. In addition, the description of the same or similar portions is not repeated in principle unless particularly required in the following embodiments. Also, in some drawings used in the embodiments, hatching is used even in a plan view so as to make the drawings easy to see.

First Embodiment

In a first embodiment, the present invention is employed for an edge-emission-type laser device. A MOVPE method is used as a method for growing a semiconductor layer, and hydrogen is used as its carrier gas. Also, triethylgallium (TEG) and trimethylindium (TMI) are used as III-group element materials, and arsine ($AsH_3$) and phosphine ($PH_3$) are used as V-group element materials. Further, disilane ($Si_2H_6$) is used as an n-type dopant, and dimethylzinc (DMZ) is used as a p-type dopant.

Figure 6:
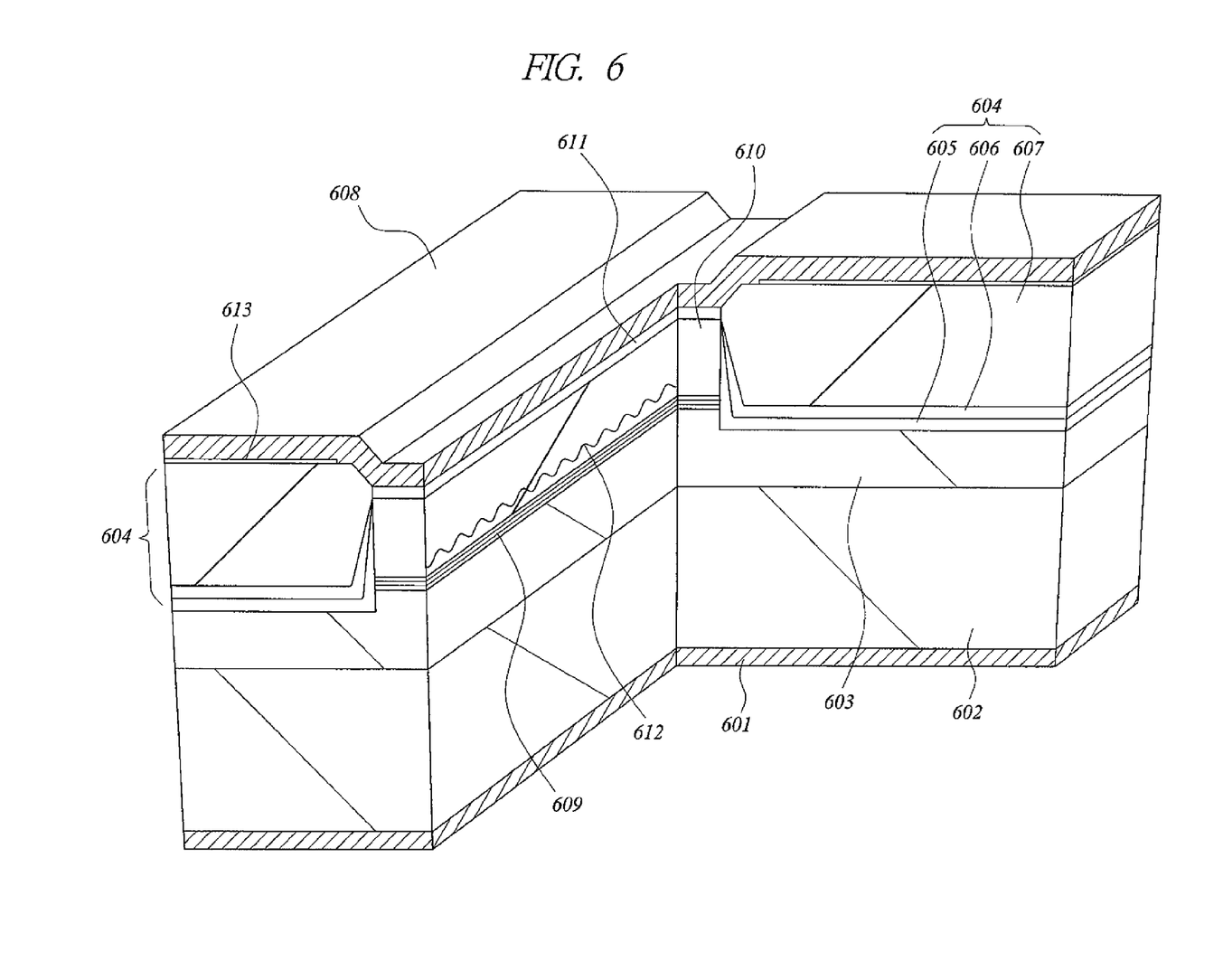
FIG. 6 is a cutaway perspective view of a principal part of an edge-emission-type laser device according to a first embodiment of the present invention.

FIG. 6 is a perspective view illustrating a cutaway part of a device according to the present embodiment. This device is manufactured by the following processes. First, an n-type InP buffer layer 603 is formed on an n-type InP substrate 602, and then, a Multi Quantum Well (MQW) layer 609 to be a laser unit formed of an InGaAsP-based semiconductor and an upper p-type InP cladding layer 610 are grown on the n-type InP buffer layer 603. Then, a cap layer made of p-type InP is normally formed to protect the upper p-type InP cladding layer 610 in most cases. However, an illustration of the cap layer is omitted.

Next, a diffraction-grating layer 612 is formed by normal processes, and then, the upper p-type InP cladding layer 610 is grown again to bury the diffraction-grating layer 612, and a $p^+$-type InGaAs contact layer 611 is sequentially formed.

Next, after a mesa-stripe mask (not illustrated) is formed on the multilayered structure as described above, other portions than the mesa structure are removed by etching, and then, the portions are buried by a Ru-doped semi-insulating buried layer 604 having a stacked structure formed of a Ru-doped InGaP wide-gap layer 605, a Ru-doped InGaP graded layer 606, and a Ru-doped InP layer 607, which are sequentially grown. Here, in the Ru-doped InGaP wide-gap layer 605, its Ga composition ratio is 0.1 and its film thickness is 10 nm. Also, in the Ru-doped InGaP graded layer 606, its Ga composition ratio is gradually decreased from 0.1 to eventually lattice-match with the Ru-doped InP layer 607.

Then, by normal device-manufacture processes, a passivation film 613, a top electrode 608, and a bottom electrode 601 are formed to complete the device.

According to the above-described buried structure, the Ru—Zn crossdiffusion does not occur, and therefore, the Ru-doped semi-insulating buried layer 604 has high insulation properties. Also, the InGaP wide-gap layer whose band gap is larger than that of InP is provided between the Ru-doped InP semi-insulating buried layer 607 and the p-type InP cladding layer 610, and therefore, the leakage current into the buried layer can be blocked.

A threshold current of the device manufactured in this manner was 15 mA at 85° C., and high optical output property over 20 mW was shown. And, a modulation property was also good. Further, a device property was not deteriorated even in a long-term operation to show high device reliability. Still further, a manufacture yield of the device was also high.

Second Embodiment

In a second embodiment, the present invention is employed for a modulator-integrated light source in which a modulator unit, a waveguiding unit, and a laser unit are integrally formed in the device. As a method for growing a semiconductor layer, the MOVPE method is used similarly to that of the first embodiment. Also, as the III-group element materials, in addition to the materials in the first embodiment, trimethylaluminum (TMA) is used as an Al material.

Figure 7:
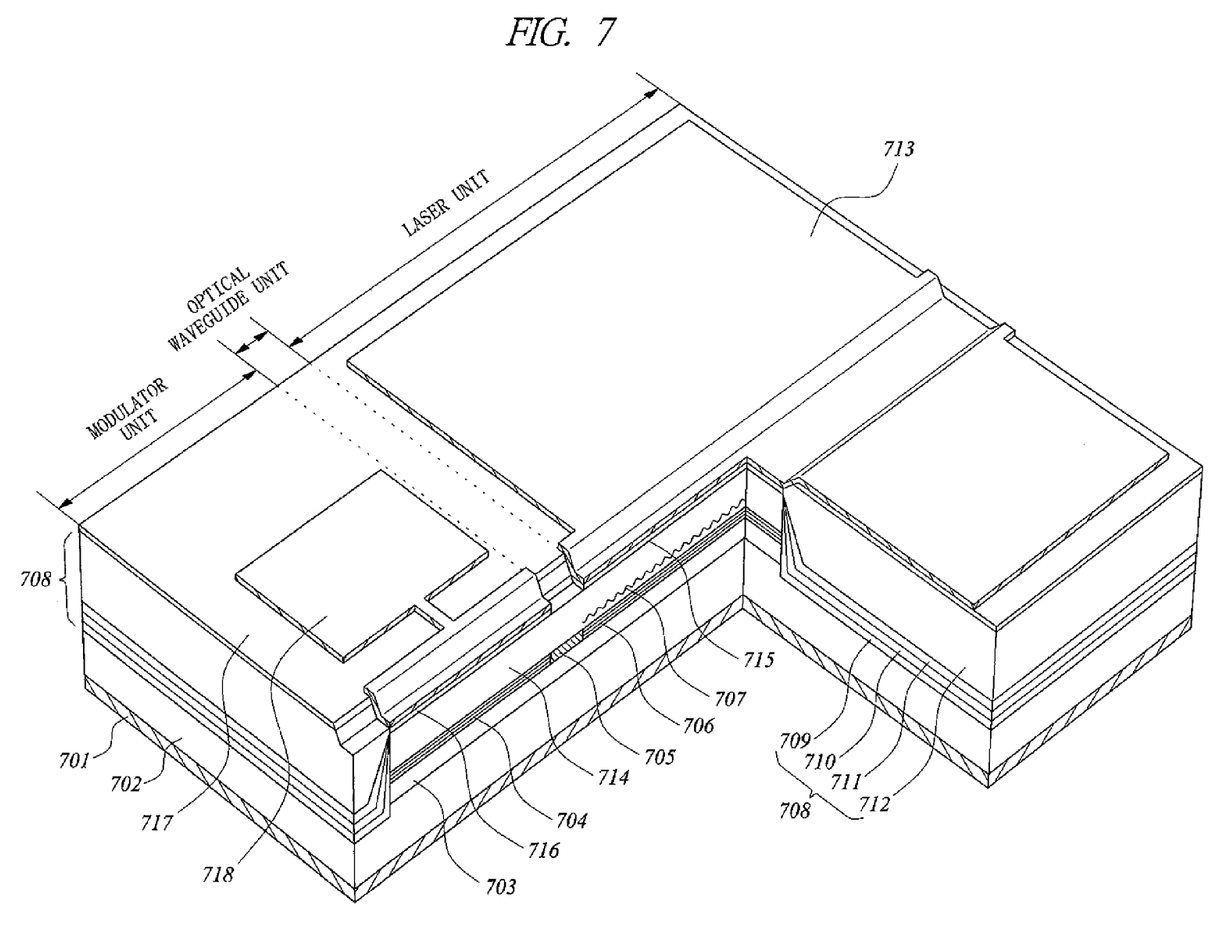
FIG. 7 is a cutaway perspective view of a principal part of a modulator-integrated light source according to a second embodiment of the present invention.

FIG. 7 is a perspective view illustrating a cutaway part of the device according to the present embodiment. This device is manufactured by the following processes. First, an n-type InP buffer layer 703 is formed on an n-type InP substrate 702, and then, a MQW layer 704 to be a modulator unit made of an InGaAlAs-based semiconductor is grown on the n-type InP buffer layer 703. Then, a cap layer made of p-type InP is normally formed to protect the MQW layer 704 in most cases. However, an illustration of the cap layer is omitted.

Next, after a mask (not illustrated) is formed at a predetermined position, the cap layer and the MQW layer 704 in a region not covered by the mask are removed by etching. Next, in a growth furnace, a MQW layer 706 to be a laser unit made of InGaAlAs, a diffraction-grating layer 707, and a p-type InP cap layer (not illustrated) are regrown in a Butt-joint (BJ) structure.

Next, the above-described mask is removed, and a BJ mask is subsequently formed again at a predetermined position of each of the MQW layer 704 being the modulator unit and the MOW layer 706 being the laser unit, and then, the MOW layers 704 and 706 and the p-type InP cap layer are removed by etching, and further, a waveguiding layer 705 made of InGaAsP and a p-type InP cap layer (not illustrated) are regrown in the BJ structure. Here, two positions of the modulator unit and the laser unit are simultaneously jointed in the BJ structure.

Next, the n-type InP substrate 702 is taken out from the growth furnace and the mask is removed, and then, a diffraction-grating layer 707 is formed on the MQW layer 706 in the laser unit. Next, in the growth furnace, a p-type InP cladding layer 714 and a $p^+$-type InGaAs contact layer (not illustrated) are grown on an entire surface of the device to complete the crystal growing process.

Next, a mesa-stripe mask (not illustrated) is formed on the above-described multilayered structure, other portions than the mesa structure are removed by etching, and then, an appropriate pretreatment is performed to bury the portions by a Ru-doped semi-insulating buried layer 708. This Ru-doped semi-insulating buried layer 708 has a stacked structure formed of a Ru-doped InGaP graded layer 709, a Ru-doped InGaP wide-gap layer 710, a Ru-doped InGaP graded layer 711, and a Ru-doped InP layer 712, which are sequentially grown. Note that, to prevent optical feedback due to reflection of emitted light, a light-emitting end on a modulator unit side has a so-called window structure buried by the Ru-doped semi-insulating buried layer 708.

Next, the $p^+$-type InGaAs contact layer above the waveguiding unit is removed for device isolation between the $p^+$-type InGaAs contact layer 716 in the modulator unit and the p-type InGaAs contact layer 715 in the laser unit, and then, a passivation film 717, a top electrode 718 in the modulator unit, and a top electrode 713 and a bottom electrode 701 in the laser unit are formed by normal device-manufacture processes to complete the device.

A threshold current of the device manufactured in this manner was 15 mA at 85° C., and an excellent modulation property of 10 GHz was shown in a range of −5 to 85° C. without a cooler. Also, a device property was not deteriorated even in a long-term operation to show high device reliability. Further, a manufacture yield of the device was also high. Note that, not only an InGaAlAs-based material but also an InGaAsP-based material, a material of an InGaAsP-based material to which Sb or N is added, or others can also be used as the MQW layer 704 in the modulator unit and the MQW layer 706 in the laser unit.

Third Embodiment

In a third embodiment, the present invention is employed for a bottom-emission-type laser device. A structure of this device is called a planar-buried-hetero structure. As a method for growing a semiconductor layer, the same MOVPE method as that of the first embodiment is used. The used materials are the same as those in the first and second embodiments.

Figure 8:
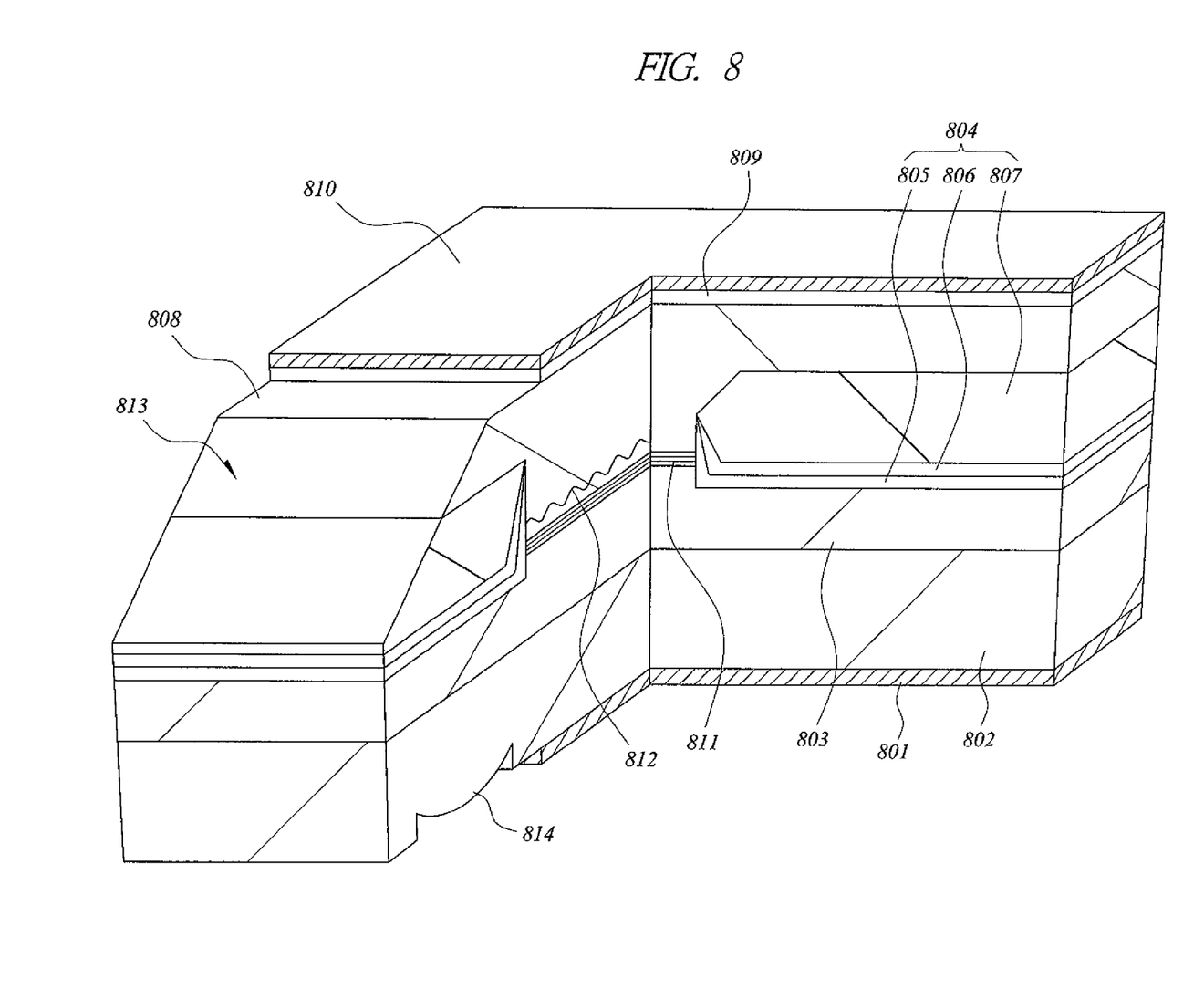
FIG. 8 is a cutaway perspective view of a principal part of a bottom-emission-type laser device according to a third embodiment of the present invention.

FIG. 8 is a perspective view illustrating a cutaway part of the device according to the present embodiment. This device is manufactured by the following processes. First, a p-type InP buffer layer 803, an MQW layer 811 in a laser unit made of an InGaAlAs-based semiconductor, and an upper n-type InP cladding layer 808 are formed on a p-type InP substrate 802. Then, a cap layer made of n-type InP is normally formed in most cases to protect a surface of the device. However, an illustration of the cap layer is omitted.

Next, after a diffraction-grating layer 812 is formed by normal processes, the diffraction-grating layer 812 is buried by a thin upper n-type InP cladding layer 808 and an InGaAsP cap layer (not illustrated).

Next, after a mesa-stripe mask (not illustrated) is formed on the multilayered structure as described above and other portions than the mesa structure are removed by etching, an appropriate pretreatment is performed to bury the portions by a Ru-doped semi-insulating buried layer 804. Here, the Ru-doped semi-insulating buried layer 804 has a stacked structure formed of a Ru-doped InGaP wide-gap layer 805, a Ru-doped InGaP graded layer 806, and a Ru-doped InP layer 807, which are sequentially grown.

Next, after the mesa-strip mask is removed and the InGaAsP cap layer is removed by an appropriate pretreatment, an upper n-type InP cladding layer 808 and an n-type InGaAsP contact layer 809 are sequentially formed. At this time, the layers are regrown under a condition that an asperity of a crystal surface formed by the growth of the Ru-doped semi-insulating buried layer 804 is flattened.

Then, after a reflecting mirror 813 having an angle of 135 degrees is formed on a surface of the device and a bottom-surface lens 814 for collection of emitted light is formed on a bottom surface of the device, a top electrode 810 and a bottom electrode 801 are formed to complete the device.

In the device manufactured in this manner, a low device resistance of 3Ω was shown, and the device was oscillated by a low threshold current of 10 mA even at 85° C. Also, an excellent modulation property of 10 GHz was shown without a cooler, and the device property was not deteriorated even in a long-term operation to show high device reliability. Further, a manufacture yield of the device was also high.

Fourth Embodiment

In a fourth embodiment, the present invention is employed for a 2×2 InP-based MQW-type MZ modulator. In this device, an input-light demultiplexer unit, a MZ modulator unit, and an output-light multiplexer unit are formed. As a method for growing a semiconductor layer, the same MOVPE method as that of the first embodiment is used. The used materials are the same as those in the first to third embodiments.

Figure 9:
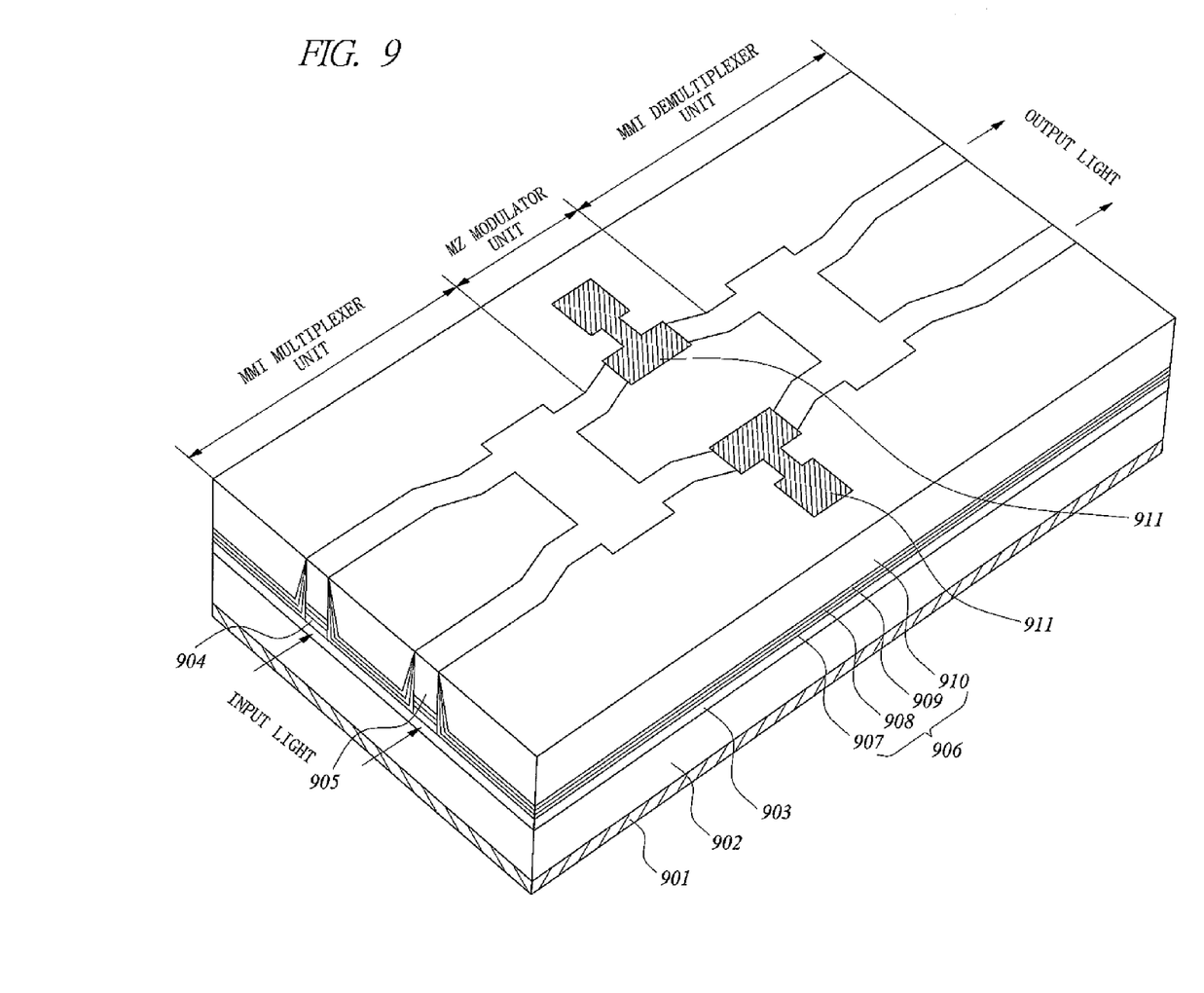
FIG. 9 is a perspective view of a MZ modulator according to a fourth embodiment of the present invention.

FIG. 9 is a perspective view illustrating a cutaway part of the device according to the present embodiment. This device is manufactured by the following processes. First, an n-type InP buffer layer 903, an MQW layer 904 made of InGaAsP, a p-type InP cladding layer 905, and a $p^+$-type InGaAs contact layer not illustrated are sequentially grown on an n-type InP substrate 902.

Next, an insulating film deposited on the $p^+$-type InGaAs contact layer is patterned in a predetermined shape, and unnecessary semiconductor layers are removed with using this film as an etching mask. Next, an appropriate pretreatment is performed to bury the portion by a Ru-doped semi-insulating buried layer 906. Here, the Ru-doped semi-insulating buried layer 906 has a stacked structure formed of a Ru-doped InP layer 907, a Ru-doped InGaP wide-gap layer 908, a Ru-doped InGaP graded layer 909, and a Ru-doped InP layer 910, which are sequentially grown. Then, unnecessary portions of the $p^+$-type InGaAs contact layer are removed, and a top electrode 911 and a bottom electrode 901 are formed to complete the device.

In the device manufactured in this manner, an excellent modulation property over 10 GHz in the entire C band was shown. Also, a driving voltage was 3 V or lower. Further, a device property did not deteriorate even in a long-term operation to show high device reliability. Still further, a manufacture yield of the device was also high.

In the foregoing, the invention made by the inventors has been concretely described based on the embodiments. However, it is needless to say that the present invention is not limited to the foregoing embodiments and various modifications and alterations can be made within the scope of the present invention.

The present invention can be employed for a semiconductor product on which a charge-trap memory is mounted, such as a NAND flash memory, a NOR flash memory, a microcomputer on which a flash memory is mounted, and others.

What is claimed is:

1. A semiconductor laser device comprising, on a semiconductor substrate:
   an n-type cladding layer; an active layer; and a p-type cladding layer,
   both sides of each of the n-type cladding layer, the active layer, and the p-type cladding layer being buried by a semi-insulating semiconductor layer, wherein
   the semi-insulating semiconductor layer has a stacked structure formed of an InP layer, an InGaP graded layer, and an InGaP layer, and
   Ru is added to each of the InP layer, the InGaP graded layer, and the InGaP layer.

2. The semiconductor laser device according to claim 1, wherein
   the InGaP layer and the InGaP graded layer are provided between the active layer and the InP layer and between either one of the cladding layers and the InP layer.

3. The semiconductor laser device according to claim 1, wherein
   the InGaP graded layer is provided between the InGaP layer and the InP layer.

4. The semiconductor laser device according to claim 1, wherein
   a film thickness of the InGaP layer is a critical thickness or thinner.

5. The semiconductor laser device according to claim 1 which is an edge-emission-type laser device.

6. The semiconductor laser device according to claim 1 which is a bottom-emission-type laser device.

7. The semiconductor laser device according to claim 1 which is a modulator-integrated light source in which a modulator unit and a waveguiding unit are further formed on a main surface of the semiconductor substrate.

8. The semiconductor laser device according to claim 1 which is a MZ modulator in which an input-light demultiplexer unit, a MZ modulator unit, and an output-light multiplexer unit are formed on a main surface of the semiconductor substrate.

9. A semiconductor laser device comprising:
   a semiconductor substrate; a first cladding layer of a first conductivity type on the semiconductor substrate; an active layer on the first cladding layer; and a second cladding layer of a second conductivity type on the active layer,
   both sides of each of the first cladding layer, the active layer, and the second cladding layer being buried by a semi-insulating semiconductor layer, wherein
   the semi-insulating semiconductor layer has a stacked structure formed of an InP layer, an InGaP graded layer, and an InGaP layer, and
   Ru is added to each of the InP layer, the InGaP graded layer, and the InGaP layer.

10. The semiconductor laser device according to claim 9, wherein
    the InGaP layer and the InGaP graded layer are provided between the active layer and the InP layer and between either one of the cladding layers and the InP layer.

11. The semiconductor laser device according to claim 9, wherein
    the InGaP graded layer is provided between the InGaP layer and the InP layer.

12. The semiconductor laser device according to claim 9, wherein
    a film thickness of the InGaP layer is a critical thickness or thinner.

13. The semiconductor laser device according to claim 9 which is an edge-emission-type laser device.

14. The semiconductor laser device according to claim 9 which is a bottom-emission-type laser device.

15. The semiconductor laser device according to claim 9 which is a modulator-integrated light source in which a modulator unit and a waveguiding unit are further formed on a main surface of the semiconductor substrate.

16. The semiconductor laser device according to claim 9 which is a MZ modulator in which an input-light demultiplexer unit, a MZ modulator unit, and an output-light multiplexer unit are formed on a main surface of the semiconductor substrate.

* * * * *